United States Patent [19]
Carrozzi et al.

[11] Patent Number: 6,130,538
[45] Date of Patent: Oct. 10, 2000

[54] MAGNETIC STRUCTURE FOR GENERATING MAGNETIC FIELDS TO BE USED IN NUCLEAR MAGNETIC RESONANCE IMAGE DETECTION, AND MACHINE FOR DETECTING SAID IMAGES

[75] Inventors: Alessandro Carrozzi, Spezia; Alessandro Trequattrini; Gianluca Coscia, both of Genoa, all of Italy

[73] Assignee: Esaote S.p.A., Monferrato, Italy

[21] Appl. No.: 09/062,777

[22] Filed: Apr. 20, 1998

[30] Foreign Application Priority Data

Apr. 29, 1997 [IT] Italy .................................. SV97A0024

[51] Int. Cl.⁷ ....................................................... G01V 3/00
[52] U.S. Cl. .......................... 324/319; 324/318; 335/299; 118/653.3
[58] Field of Search ..................... 324/319, 318, 324/322, 309; 335/299, 216; 118/653.3

[56] References Cited

U.S. PATENT DOCUMENTS

| 5,138,326 | 8/1992 | Edwards et al. ................... 324/319 |
| 5,378,988 | 1/1995 | Pulyer ................................. 324/318 |
| 5,436,607 | 7/1995 | Chari et al. ......................... 335/216 |

FOREIGN PATENT DOCUMENTS

| 0875 768 | 4/1998 | European Pat. Off. ...... G01R 33/383 |
| 6-197715 | 2/1996 | Japan . |

Primary Examiner—Christine K. Oda
Assistant Examiner—Brij B. Shrivastav
Attorney, Agent, or Firm—Burns, Doane, Swecker & Mathis LLP

[57] ABSTRACT

A magnetic structure for generating magnetic fields to be used in nuclear magnetic resonance image detection, having means (1, 101, 201, 301, 101', 201', 101", 201", 3, 3') for generating a magnetic field with the characteristics required to obtain valid images inside a predetermined tridimensional area (102), being at least a part of a cavity (2), which is at least partially contained in the magnetic structure. According to the invention, the means for generating the magnetic field consist of at least one coil (3, 3'), of the resistive or superconductive type. The coil (3, 3') is associated to an element (1) made of a highly permeable material, the so-called yoke, which defines a cavity (2), having at least one open side, whereas one or more inner pole pieces (101, 201, 301; 101', 202'; 101", 201") branch out of the inner side facing the cavity (2) of the yoke (1), at least in the area (102) which is meant to receive the body or the part thereof to be scanned, and terminate with a free end inside the cavity (2), around which pole piece or pole pieces, the coil or coils (3, 3') for generating the magnetic flow are arranged.

29 Claims, 6 Drawing Sheets

MAGNETIC STRUCTURE FOR GENERATING MAGNETIC FIELDS TO BE USED IN NUCLEAR MAGNETIC RESONANCE IMAGE DETECTION, AND MACHINE FOR DETECTING SAID IMAGES

BACKGROUND OF THE INVENTION

1. Field of the Invention

The invention relates to a magnetic structure for generating magnetic fields to be used in nuclear magnetic resonance image detection, and in particular having means for generating a magnetic field with the characteristics required to obtain valid images inside a predetermined tridimensional area, 2. Description of Related Art Prior art magnetic structures may be substantially of two types, i.e. magnetic structures using permanent magnets, or magnetic structures using electromagnets either of the resistive or of the superconductive type. These structures are used both for total body image detection, in which the body under examination is substantially completely inserted inside the magnetic structure, and for the detection of particular target zones, like specific limbs, or else.

In order to obtain valid images through the use of nuclear magnetic resonance, the magnetic field must have certain characteristics, namely in intensity and homogeneous distribution, at least in the volume being meant to receive the body or the part thereof to be examined. Unless a homogeneous distribution, within predetermined tolerances, is reached, the image obtained by spin echoes is of no use, since it does not correspond accurately to real conditions.

In order to provide magnetic fields having the characteristics required to obtain valid, i.e. useful nuclear magnetic resonance images, prior art magnetic structures are of considerable size. Hence, said structures are heavy, uneasy to handle, and expensive, not only per se, but also due to the consequences on the whole structure of the apparatus.

This drawback is notably more serious in case of magnetic structures for the examination of particular parts or zones of the body, which require a higher handleability and also a lower cost.

Further magnetic structures are currently known, of the so-called open type, having apertures for access to the volume being meant to receive the body or the part thereof to be examined, on at least three sides, and having substantially C- or U-shaped conformations. Although these known structures allow for an easier access, they do not solve the handleability and space requirement problems. To obtain the desired and necessary magnetic field characteristics, the magnetic structures must have a huge size, so that the field distortion areas along open sides may be kept as far as possible, whereas the possible means for compensating distortions are substantially of the passive type, and are not sufficient to allow for a dimensional contraction of the structures.

OBJECTS AND SUMMARY

The invention has an object to provide a magnetic structure of the type described hereinbefore, in such a way that, through simple and cheap expedients, the above drawbacks may be obviated, by reducing the size and the costs of the magnetic structures, while providing the same quality of the detected image, and the same functionality.

The invention also has an object to provide a magnetic structure of the type described hereinbefore, particularly compact, so that it is not disproportionate with respect to the size of the examined part, the whole in a relatively simple, cheap and reliable way as regards functionality.

An embodiment of the invention achieves the above objects with a magnetic structure of the type described hereinbefore, in that it has at least two pairs of opposite pole pieces and at least one coil for each pole piece of said two pairs.

At least one of the two pairs of pole pieces defines on opposite sides the volume, inside the cavity, being meant to receive the body or the part thereof under examination.

Preferably, the magnetic structure has at least three open sides, whereas said pair of pole pieces which defines on opposite sides the volume, inside the cavity, being meant to receive the body or the part thereof under examination, is the one at the longest distance from at least one of the open sides.

Preferably, the pole pieces of each pair are coaxial to each other.

Further, there may be provided that the two pole pieces of the pairs, on opposite sides, are surrounded by at least one common field coil, whereas each pole piece or only one of them has an additional reserved coil.

Further, there may be provided a greater number of pairs of pole pieces, with different arrangements of the magnetic field coils, associated thereto, both common and reserved. In this case, the pairs of pole pieces are preferably arranged symmetrically.

Advantageously, both the yoke and the cavity have a symmetrical shape, with respect to at least one axis.

The yoke may particularly have an annular closed shape, in which the cavity is only open on the two opposite sides, transverse to the axis. The yoke may have an open annular shape, or may simply be a connection element of pole pieces, which define, with their opposite sides, a cavity, i.e. a predetermined volume, only on two opposite sides.

Particularly, when the yoke has an open annular shape the pairs of pole pieces may be arranged side-by-side with respect to the closed side-to-open side direction.

However, in the latter case, in which the cavity is substantially only defined by two opposite sides of the opposite surfaces of the pole pieces, the different pairs of pole pieces are arranged concentrically, the outer pole pieces having annular shapes. Particularly, in this case the pairs of pole pieces have circular shapes, either annular, or, for the inner pair, cylindrical.

The pairs of pole pieces may have expansions of the same length or of different length, in such a way that the opposite surfaces of the pole pieces of each pair are at different distances and at different levels from pair to pair.

Moreover, the opposite surfaces of the pairs of pole pieces may be parallel or orientated so as to diverge or converge, and be substantially plane or shaped with predetermined identical profiles, complementary to or different from each other.

The arrangement of the field coils may also change. The coils associated to the opposite pole pieces of the different pairs may be oriented with their axes parallel and coincident, or the axes may be inclined to such an extent that the coils may take diverging or converging positions with respect to certain axes.

Thanks to the above expedients, the embodiment of the invention allows magnetic fields to be obtained that have the necessary characteristics as regards field intensity and homogeneity, by using electromagnetic coils to generate fields, and allowing the magnetic structure to have cavities with more open sides, to suit the different morphological needs of the bodies and parts thereof for which they are designed.

The magnetic field intensity may be adjusted according to the current circulating in the generating coils. The provision of several coils associated to several pairs of pole pieces allows to change the behavior of the magnetic field, in the space inside the cavity, so as to compensate the deformations and deviations from the design values, caused by magnetic structures having cavities with complex profiles, and magnetic structures with several open sides.

By providing reserved field coils for each pole piece or for at least some of the pole pieces, besides adjusting the field intensity, according to the power supply and the change of the field distribution, through the particular shape and arrangement of the pole pieces, it is also possible to modify the ratios between magnetic potentials in the different poles, so as to further modify the spatial distribution of the field. Therefore, the invention allows to harmonize the possible different shapes of cavities, fitting the morphology of the body or parts thereof to be received therein, with the magnetic field intensity and homogeneity requirements, in the volume being meant to receive the body or the part thereof to be examined, needed to obtain valid nuclear magnetic resonance images.

The invention also relates to a nuclear magnetic resonance image detecting machine, of the type designed for the shoulder of the human body, said machine having a magnetic structure with three open sides, and with the characteristics described above.

Thanks to the expedients according to the invention, there may be provided a magnetic structure of a sensibly reduced size, to detect nuclear magnetic resonance images in the shoulder zone, thus avoiding the considerable drawbacks of prior art machines of the same purpose, which have a definitely excessive size with respect to the part under examination. Such a huge size affects not only the purchase costs, but also machine installation costs.

BRIEF DESCRIPTION OF THE DRAWINGS

The characteristics of the invention and the advantages derived therefrom will appear more clearly from the following description of some embodiments, illustrated by way of a non-limiting example, in the annexed drawings, in which.

DETAILED DESCRIPTION OF THE PREFERRED EMBODIMENTS

Figure 1:
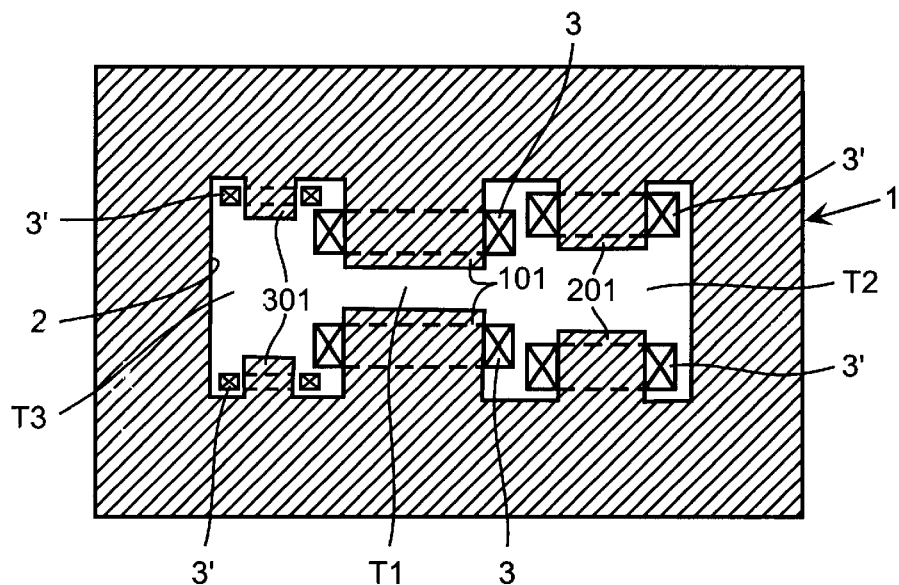
FIG. 1 is a diagrammatic cross-sectional view of a magnetic structure according to the invention, having an annular shaped yoke.

With reference to FIG. 1, a first embodiment of the magnetic structure according to the invention comprises a metal element for enclosing the magnetic flow, the so-called yoke, having an annular shape, closed in itself, and being globally indicated as 1. The yoke 1 defines a cavity 2. The shape of the yoke 1 and of the cavity 2 is preferably symmetrical with respect to two transverse and perpendicular axes, whereas, in the direction of the axis, the annular yoke 1 has a certain length and is open on its two ends.

Three opposite pairs of pole pieces 101, 201, 301 branch out of the inner walls of the yoke 1. The pole pieces of each pair are coaxial to each other and terminate with their opposite surfaces being spaced to a predetermined extent, thus defining a magnetic gap T1, T2, T3.

The pairs of pole pieces 101, 201, 301 are arranged side-by-side and at a certain distance from each other. Preferably, their arrangement is symmetrical with respect to the two perpendicular transverse axes of the yoke 1.

Particularly, a first pair of pole pieces, indicated as 101, is provided in the central area, whereas on the two sides, there are provided the other pairs of pole pieces 201, 301. Each pole piece is surrounded by its magnetic field coil, coils being indicated as 3, 3' respectively.

The arrangement and distribution of coils 3, 3' is determined by the desired magnetic field characteristics, in a region of the cavity 2 being meant to receive the part under examination.

Particularly, said relevant region is generally indicated as 102, and is situated in the zone defined by the magnetic gap T1.

The coils 3, 3' may be either of the resistive type, possibly appropriately cooled, or of the superconductive type, there being provided the appropriate means for cooling them to the temperatures required to obtain that characteristic, depending on the material used to manufacture the coils.

The coils 3', associated to the pole pieces 201, 301 of the two lateral pairs, substantially have the function to correct the magnetic field generated by the coils 3, associated to the pole pieces 101, in the volume 102 being meant to receive the body or the part thereof, which is relevant for image detection, in such a way that the magnetic field in said region 102 has sufficient characteristics, as regards intensity and homogeneity of its spatial distribution, which may ensure that the nuclear spins in the part under examination are coded, so as to obtain back echoes of nuclear spins, providing sufficiently accurate, i.e. useful and valid nuclear magnetic resonance images.

As shown in FIG. 1, both the pole pieces 101, 201, 301 and the coils 3, 3' may have such shapes, dimensions and arrangements as to optimize the two parameters of intensity and homogeneous distribution, required to detect valid images, combined with a substantial adaptation to the morphology of the bodies under examination.

This allows the magnetic structure to be substantially compacted, so as to substantially follow the main morphological characteristics of the bodies under examination or of the parts thereof, which are to be inserted into the cavity 2, and particularly in the region 102 thereof. The advantages of this arrangement are remarkable, especially when this image detection technique must be applied to bodies like those of human, animal or vegetal beings, in which the part to be examined cannot be separated from the rest of the body.

As shown in FIG. 1, for example, the result is achieved, in this case, by providing two dimensionally different lateral pole pieces 201, 301.

So, the magnetic structure is provided with a cavity, accounting for a morphology in which, for example, the body under examination has a wider extension in one or both zones associated to the lateral ends of the cavity 2, although said zones are not meant to be scanned, to obtain the nuclear magnetic resonance image.

Since the profile of the magnetic structure, i.e. of the cavity 2, may be made to substantially correspond to the body profile, whose part coinciding with the region 102 is to be scanned, the magnetic structure may have a more compact form, implying evident advantages, both as regards construction and as regards costs.

In order to optimize the magnetic field in the relevant area 102, its intensity may be adjusted not only by conforming the cavity and therefore the pole pieces 101, 201, 301, but also by controlling the currents circulating in the coils 3, 3'.

The currents and the size and arrangement of the pole pieces 101, 201, 301, may be determined for optimizing the magnetic field characteristics, by applying the normal electromagnetism laws, so as to obtain the desired field characteristics in the volume or in the predetermined region 102. In this case, such laws must be applied to the specific structure and the corresponding equations must be solved.

Figure 2:
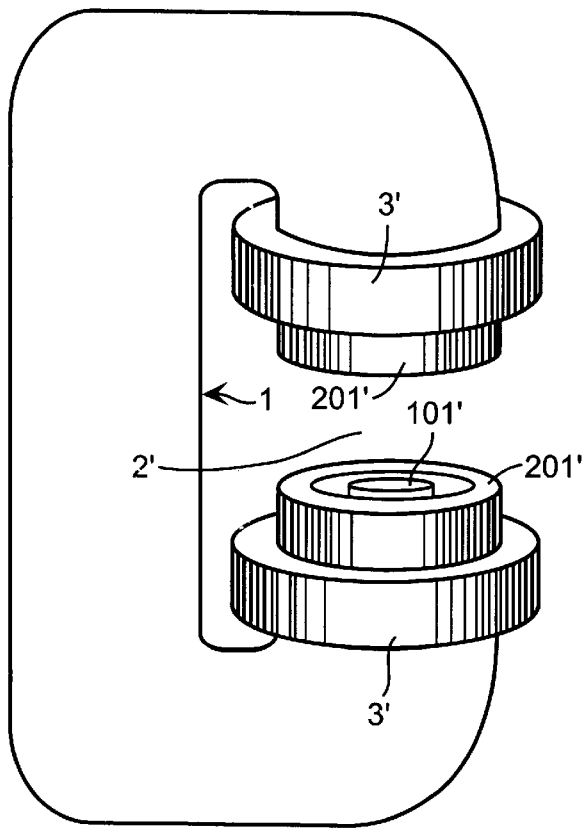
FIG. 2 is a diagrammatic perspective view of a magnetic structure according to the invention, whose cavity is only defined by pairs of opposite coaxial pole pieces.
Figure 3:
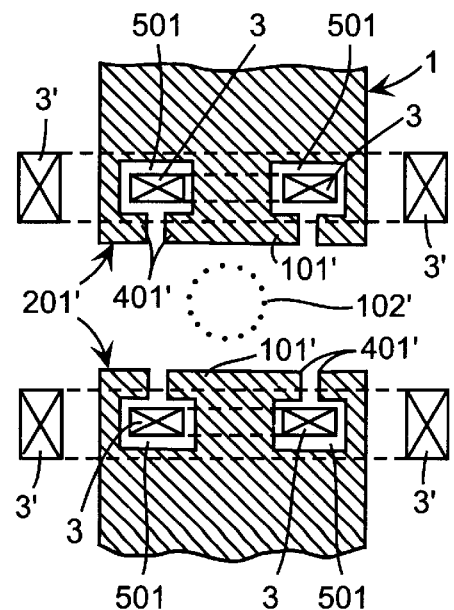
FIG. 3 is an axial sectional view of the region including the opposite pole pieces according to FIG. 2.

FIGS. 2 and 3 show another magnetic structure embodying the principle of the present invention.

In this case, the magnetic structure comprises a C-shaped yoke 1, which connects two pairs of concentric pole pieces.

The cavity 2', having a rotational symmetry, is open on all walls parallel to the axis of the pole pieces. The two pairs of pole pieces 101' and 201' are disposed concentrically, the outer pole piece 201' having an annular shape and being substantially designed to correct the spatial distribution of the magnetic field in the volume region 102', between the two pole pieces 101' of the central pair. These pole pieces 101' have opposite circular surfaces, concentric to the outer annular pole pieces 201'.

The end surfaces on the opposite sides of the two pairs of pole pieces 101' and 201' are substantially plane and may extend, depending on different requirements, either flush to each other or at different levels.

In this arrangement, the two coils 3, 3', which surround the pole pieces 101', 201' are also concentric and may be disposed at different levels or at the same level.

However, the configuration shown in FIGS. 2, 3 involves a substantial variant with respect to the one show in FIG. 1, since the outer coil 3' surrounds both the outer and the inner pole pieces 201', 101', while the inner coil 3 is associated to the inner pole pieces 101'. Obviously, also in this case, there might be provided, if required, a coil 3', associated to the outer pair of pole pieces 201', only surrounding the latter.

With particular reference to FIG. 3, the pole pieces 101', 201' of the two pairs, form an annular gap therebetween, for housing the inner coil 3. Said pole pieces 101' and 201' may be shaped in such a way as to have opposite annular wider portions, in the form of peripheral flanges 401', which are situated at the free ends of said pole pieces 101' and 201', and superpose the inner coil 3, while partially closing, i.e. reducing the opening of the open side of the groove 501 for housing said coil.

Such a flange might be also provided along the outer peripheral side of the outer annular pole pieces 201', for partially or completely covering the outer coil 3', whenever this is necessary to provide the region 102' with the desired field characteristics as regards intensity and distribution.

This configuration, which may be optimized like the one described above, provides evident advantages as regards multiple applications to different morphologies of bodies or parts thereof.

A possible improvement might be achieved by making the yoke 1 extensible with respect to its branch parallel to the axis of the pole pieces 101' and 102' and/or to the branches transverse to said axis. In this case, provided that the limits of the variation ranges of currents or of the corrections of the achievable magnetic field distribution are not exceeded, the corrections required to adapt the magnetic structure to the new size of the yoke 1 might be made automatically, with the help of an appropriate computer, having the computing programs for the substantial adjustment of the currents circulating in the two coils 3, 3', stored therein. The magnetic structure may be dimensionally adapted in a very simple manner, by providing a set of assemblable and disassemblable modular elements.

The yoke 1 is required to be highly permeable to the magnetic flow, in such a way that the magnetic field inside the yoke is very low, or actually null.

Figure 4:
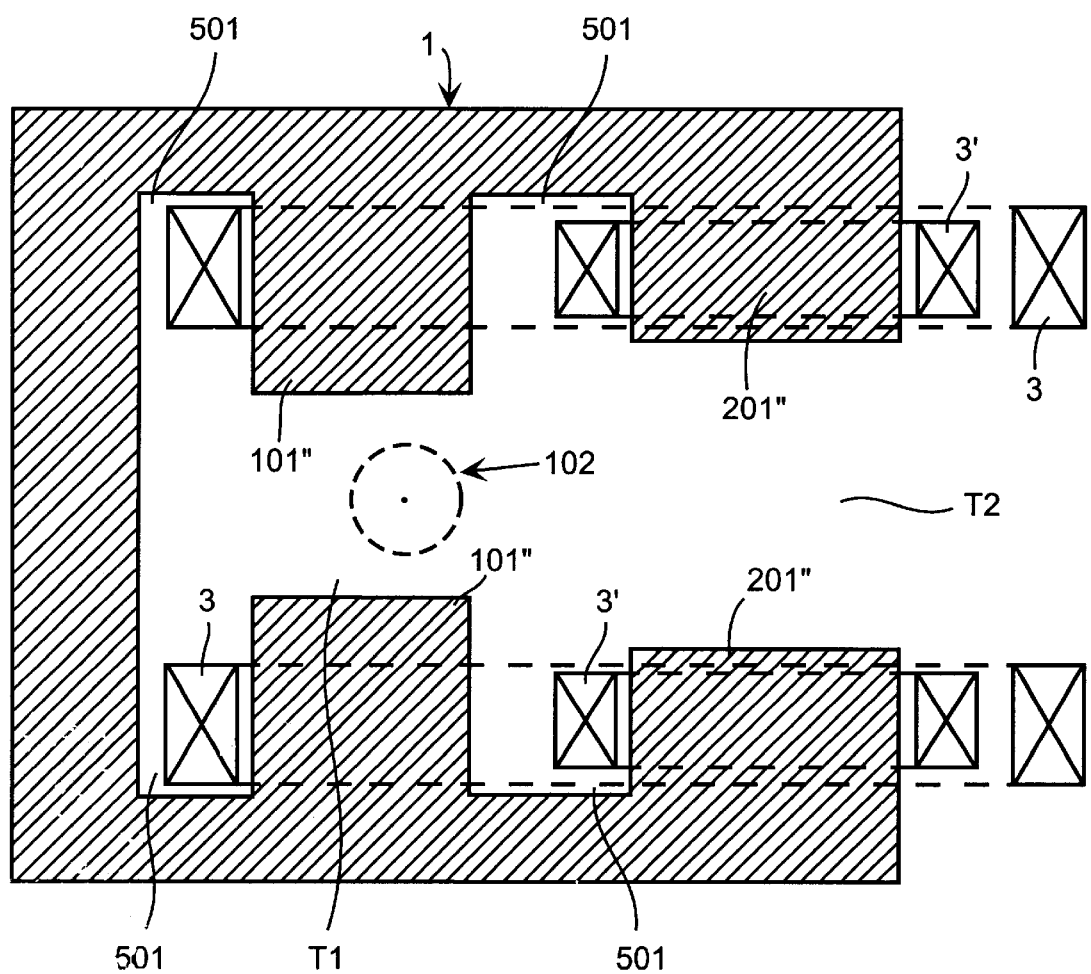
FIG. 4 is a diagrammatic cross sectional view of a magnetic structure having an open annular shaped yoke.
Figure 5:
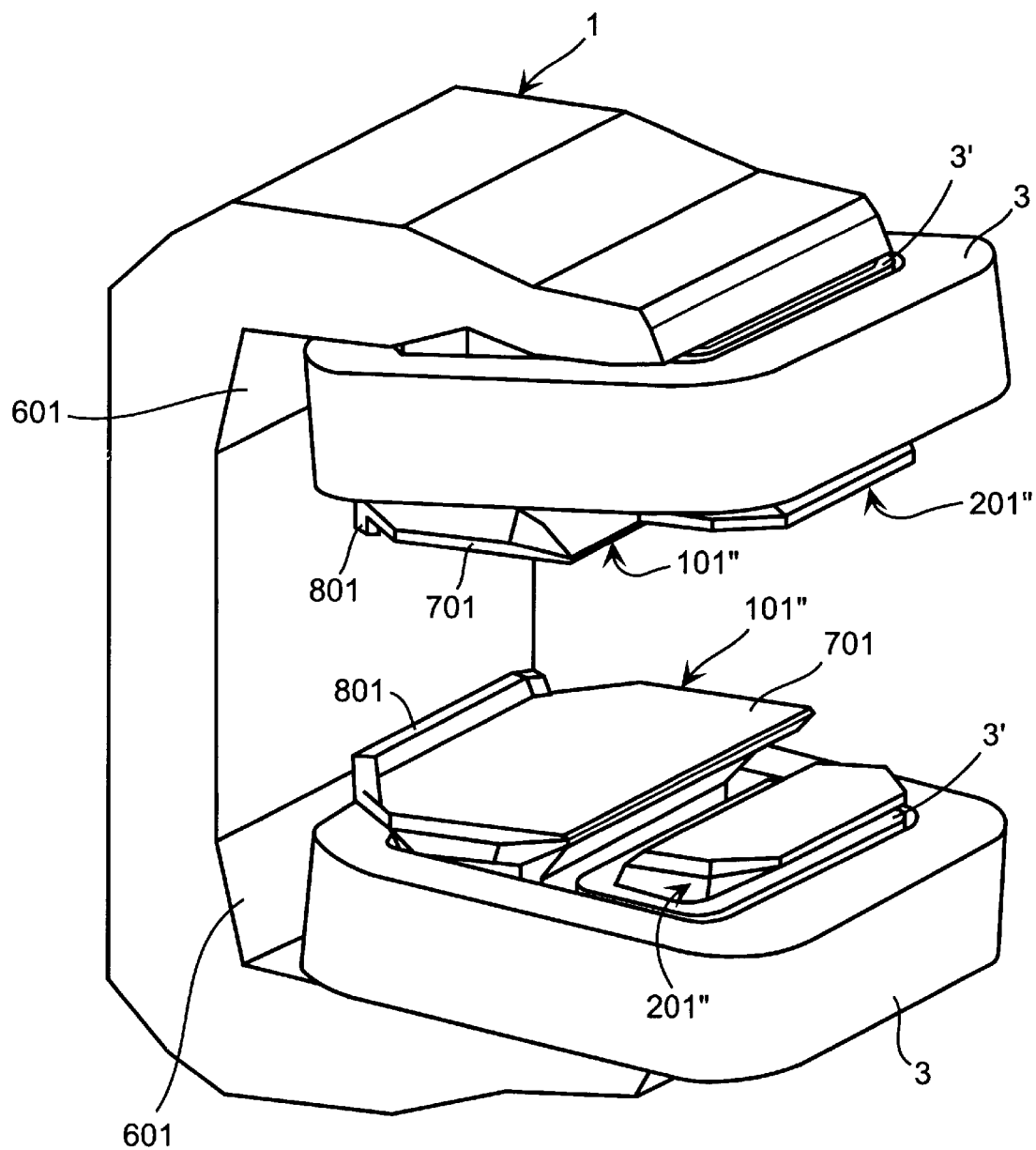
FIG. 5 shows a preferred embodiment of a magnetic structure having a U-shaped yoke, for a machine particularly suitable for the nuclear magnetic resonance detection of images in the shoulder zone of the human body.
Figure 7:
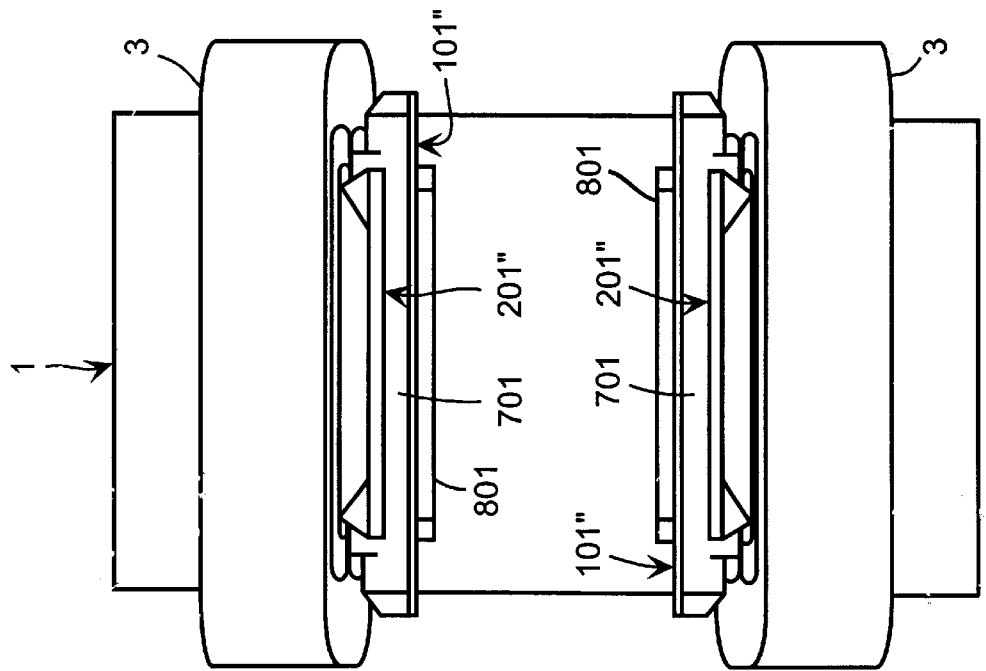
FIGS. 6, 7, 8 show, in a reduced scale, the magnetic structure according to FIG. 5, in lateral, frontal and top views respectively.
Figure 6:
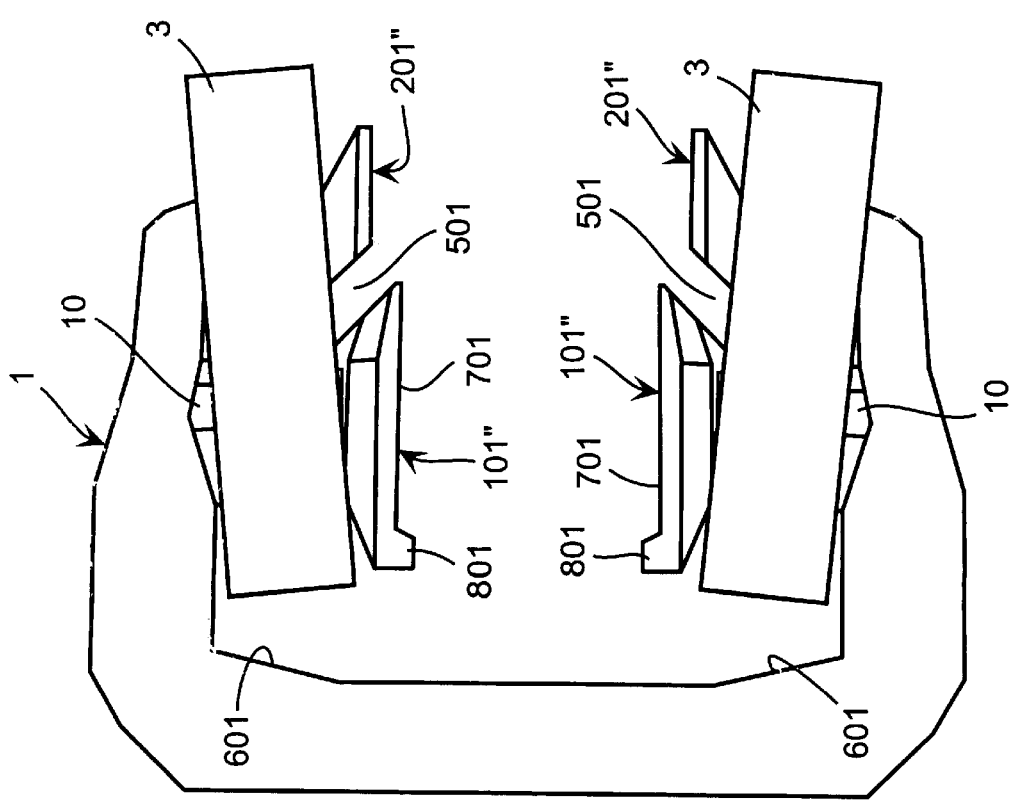
Figure 8:
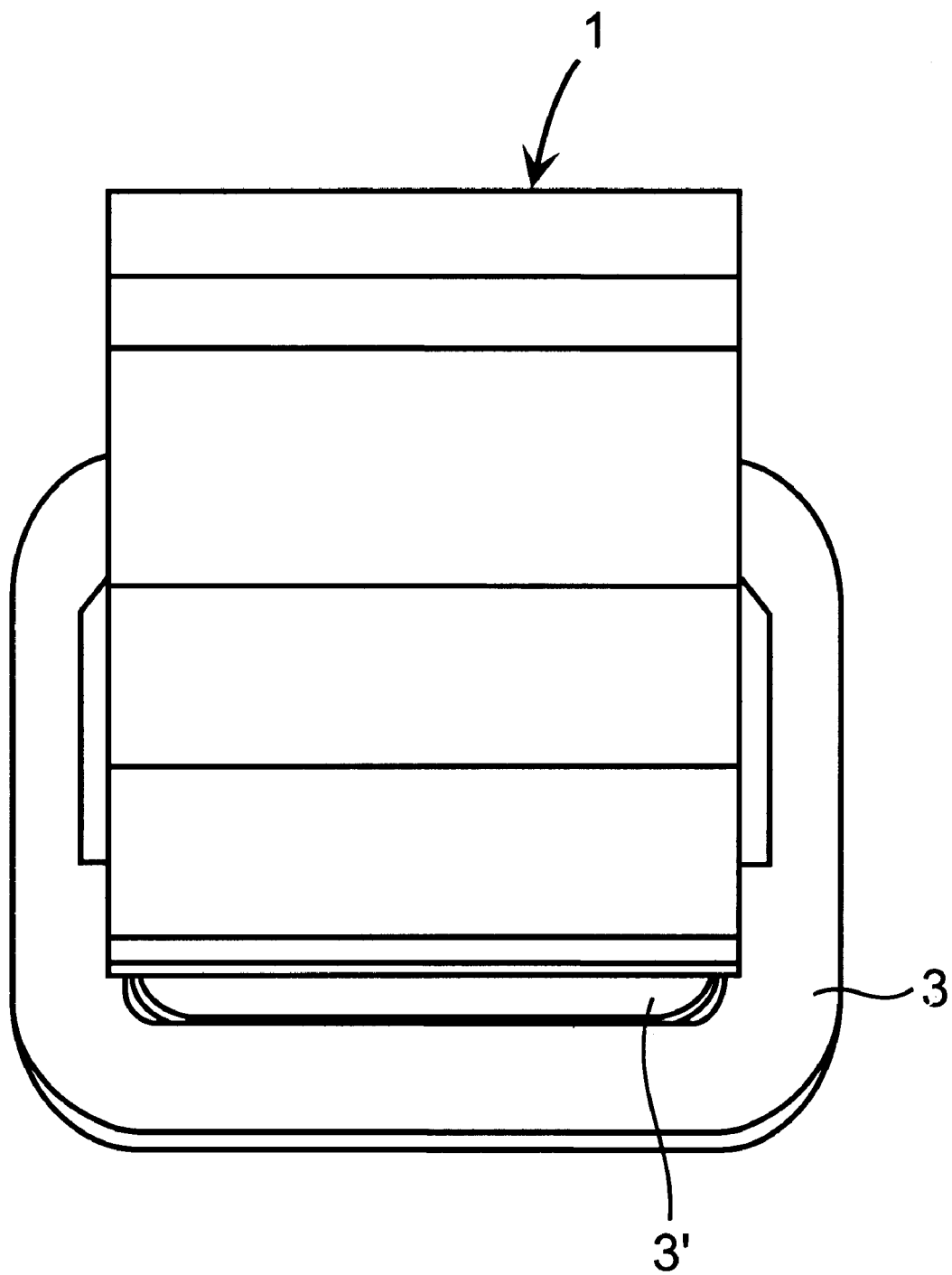
Figure 9:
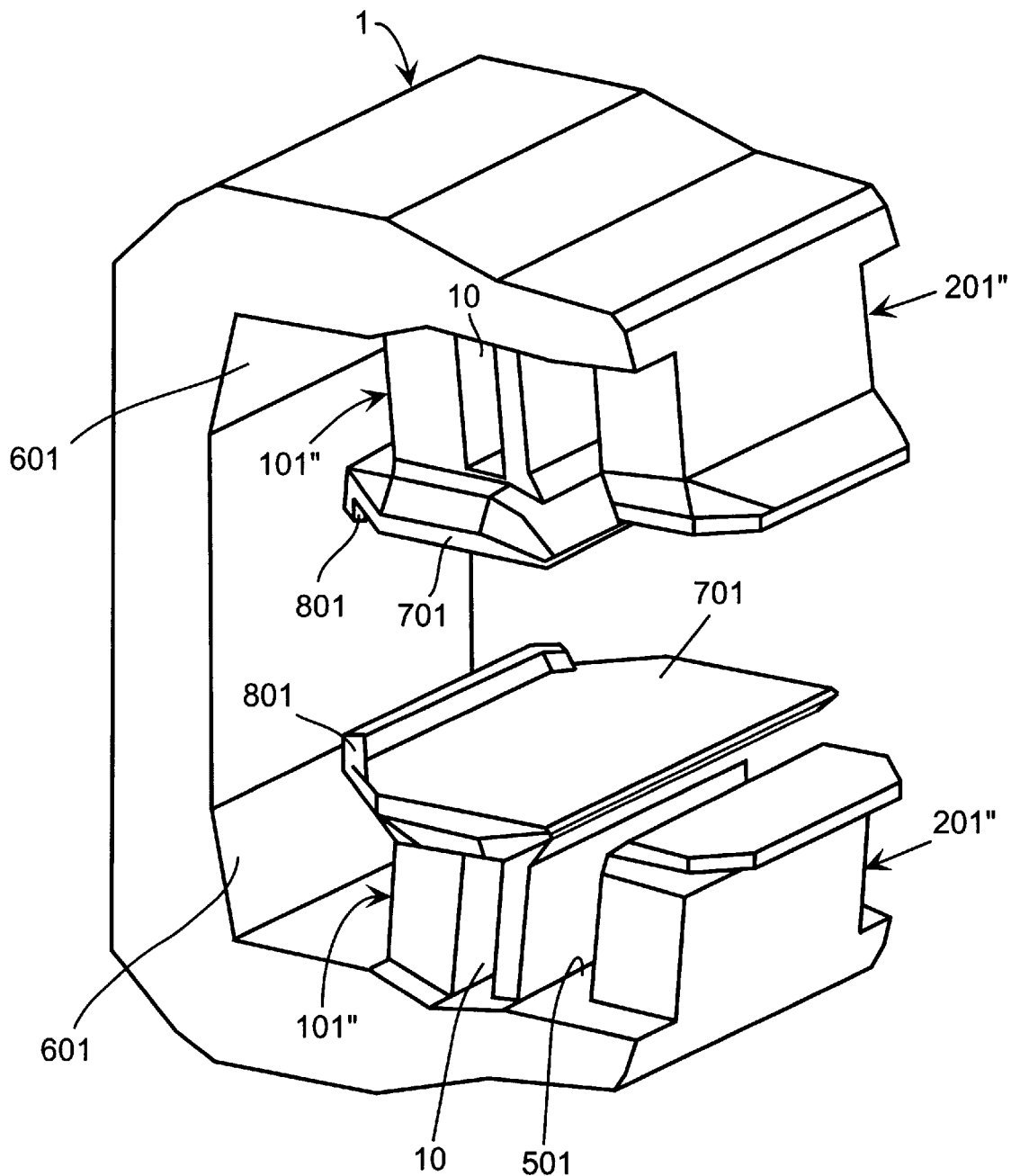
FIG. 9 is a perspective view of the yoke and pole pieces of the magnetic structure according to FIGS. 5 to 8.

A further embodiment of the invention is schematically illustrated in FIG. 4.

In this case, the yoke 1 is U-shaped and the cavity 2 defined thereby has three open sides. The yoke 1 has pole pieces 101" and 201" on the two opposite branches of the U shape, which form two coaxial pairs of opposite pole pieces. The relevant area for receiving the body or the part thereof to be examined is indicated as 102 and is made to substantially correspond to the magnetic gap T1 between the pole pieces 101" on the closed side of the U-shaped yoke 1. The pole pieces 201" of the other pair are disposed at the free ends of the two branches of the U-shaped yoke 1.

The pole pieces 101" and 201" are arranged and dimensioned so as to define grooves for holding the coils 3, 3' therein and towards the parallel closed branch of the U-shaped yoke 1. Also, this embodiment provides two coils 3, 3', one surrounding both the pole pieces 101", 201" associated to a branch of the U-shaped yoke 1, and the other only surrounding the pole pieces 201" at the free end of the branches of the U-shaped yoke 1.

According to a further characteristic, the inner pole pieces 101" terminate at a shorter distance from each other with respect to those 201" at the end of the branches of the U-shaped yoke 1, thus substantially forming a cavity which widens in the direction of the open transverse side of the U-shaped yoke 1.

Thanks to the pole pieces 201" and to the coils 3' associated thereto, the magnetic field may be modified in the region of the magnetic gap T1, i.e. in the volume 102, for receiving the body or the part to be examined, in such a way as to compensate the deviation from the required field distribution characteristics in said region 102, and caused by the opening of the yoke 1 on one side parallel to the axis of the pole pieces 101" and 201", thus providing valid nuclear magnetic resonance images even when the electromagnetic structure is open.

Such a configuration is very advantageous for detecting nuclear magnetic resonance images in the shoulder zone. In this case, the widening on the open side of the U-shaped yoke 1 allows to slip the magnetic structure onto the shoulder, accounting for the thickness increase in the thorax zone, and thus substantially following its morphology. In this case too, the morphological adaptation is achieved while maintaining the quality of the detected images, and the reduction of the magnetic structure size and of the apparatus costs.

A more detailed and less schematic example of a magnetic structure whose configuration is substantially like the one according to FIG. 4 is shown in FIGS. 5 to 9.

Substantially, the magnetic structure according to those figures is identical to that of FIG. 4. The two examples differ for a few characteristics required to optimize the magnetic field characteristics in the volume or region 102 of the cavity 2.

The yoke 1 has a variable section in the area 601 connected to the branches of the U shape. Moreover, said branches get increasingly thinner towards the free ends, both on the outer and on the inner sides.

The pole pieces 101 of the first pair have a passage aperture which divides them into two spaced parts, in the yoke closed side-to-open side direction. The passage aperture substantially extends from the basis of the pole pieces 101", at the branches of the yoke 1 up to a common end plate. Said plate 701 widens on all sides, preferably in a flared way, partially superposing the coil 3. The plate 701 laterally narrows on both sides in the direction starting from the closed side of the U-shaped yoke 1, whereas, along the edge facing towards and parallel to said closed side of the U-shaped yoke 1, the plate 701 has a tooth 801, whose cross section is substantially shaped like a rectangular trapezium, which projects towards the opposite and coaxial pole piece 101".

The pole pieces 201" at the ends of the two opposite branches of the U-shaped yoke 1 also terminate with a plate 901, flaringly widening both laterally and at the open side of the U-shaped yoke 1, and projecting out, beyond the ends of its branches, and partially superposing the coil 3' associated thereto. The extension of the pole pieces 201", projecting out at the open side of the yoke 1 narrows, laterally, like at the opposite side of the pole pieces 101".

The coils 3 surround both the pole pieces 101" and the pole pieces 201", together with the coil 3', associated thereto.

According to a further characteristic, at least one of the coils 3, 3' is oriented so as to be inclined, to such an extent that the two opposite coils 3, 3', having the same function and dimension, are divergently positioned towards the open side of the yoke 1.

Particularly, both coils 3 and coils 3' are inclined. The inclination may be either different or equal for the two coils 3, 3'.

Thanks to the above expedients, it is possible to reduce the size, and therefore the costs and the required space of the magnetic structure, particularly to shorten the yoke 1 with respect to the extension from the closed side to the open side thereof, while maintaining the magnetic field characteristics in the region 102 unaltered.

Naturally, the invention is not restricted to the embodiments illustrated and described herein, but may be greatly varied, especially as regards construction. Particularly, there may be also provided separate pole pieces, associated to field coils, either separate or shared by other pole pieces, being adjacent thereto even in other directions, such as a distribution of pairs of pole pieces extending according to two dimensions, one being perpendicular and the other parallel to the axis of the cavity.

Instead of only providing magnetic field coils, the latter may be replaced by equivalent configurations of permanent magnets, or there may be provided, combinedly, both magnetic field coils and permanent magnets, appropriately arranged so as to obtain the desired characteristics of the magnetic field.

The whole without departure from the guiding principle disclosed above and claimed below.

What is claimed is:

1. A magnetic structure for generating magnetic fields to be used in nuclear magnetic resonance image detection, comprising:
   a yoke made of a material provided with a high permeability to magnetic flow and which yoke includes a cavity;
   means for generating a magnetic field with characteristics required to obtain valid images inside a predetermined tridimensional area, being in at least a part of the cavity;
   the means for generating the magnetic field includes at least one coil of the resistive or superconductive type;
   the cavity having at least one open sides;
   at least two pairs of opposite inner pole pieces branch out of an inner side facing the cavity of said yoke at least in an area corresponding to a volume which is meant to receive a body or a part thereof to be scanned, and terminate with a free end inside the cavity;
   a coil for generating the magnetic field is arranged around each of the opposite inner pole pieces of said two pairs.

2. A magnetic structure as claimed in claim 1, wherein at least one of the two pairs of pole pieces defines on opposite sides thereof the volume inside the cavity meant to receive the body or the part thereof under examination.

3. A magnetic structure as claimed in claim 1 wherein the cavity it has at least three open sides, whereas said pair of pole pieces which defines on opposite sides the volume inside the cavity meant to receive the body or the part thereof under examination, is the one at a longest distance from at least one of the open sides.

4. A magnetic structure as claimed in claim 1, wherein the pole pieces of each pair are substantially coaxial to each other.

5. A magnetic structure as claimed in claim 1, wherein the two opposite pole pieces of the pairs of pole pieces, are surrounded by at least one common field coil, whereas each pole piece or only one of them has an additional separate reserved coil.

6. A magnetic structure as claimed in claim 1, wherein the pairs of pole pieces are preferably arranged symmetrically to each other.

7. A magnetic structure as claimed in claim 1, wherein both the yoke and the cavity have a symmetrical shape, with respect to at least one axis.

8. A magnetic structure as claimed in claim 1, wherein the pole pieces are spaced so as to form intermediate throats for housing the coils.

9. A magnetic structure as claimed in claim 1, wherein the pole pieces have lateral portions on at least one side, at least partially, superposing the side of the coil facing them inside of the cavity, i.e. the free end of the pole pieces.

10. A magnetic structure as claimed in claim 1, wherein the pole pieces have passage apertures or gaps of such a length as to divide them at least in their median region, into two spaced parts.

11. A magnetic structure as claimed in claim 1, wherein the pairs of pole pieces have expansions of the same length or of different length, in such a way that the opposite surfaces of the pole pieces of each pair are at identical distances or at different distances and at different levels from pair to pair.

12. A magnetic structure as claimed in claim 1, wherein the opposite surfaces of the pairs of pole pieces are parallel or orientated so as to diverge or converge, and be substantially plane or shaped with predetermined identical profilers complementary to or different from each other.

13. A magnetic structure as claimed in claim 1, wherein the opposite surfaces of the pole pieces have an extension, at one of their edges, which projects towards the opposite surface of the opposite pole piece.

14. A magnetic structure as claimed in claim 1, wherein the arrangement of the field coils may be different or identical for each pair of associate pole pieces.

15. A magnetic structure as claimed in claim 1, wherein the coils associated to the opposite pole pieces of the different pairs may be oriented with their axes parallel and coincident, or the axes may be inclined to such an extent that the coils may take diverging or converging positions with respect to certain axes, with identical or different inclinations for pairs of coils having equal functions or for all coils.

16. A magnetic structure as claimed in claim 1, wherein the pole pieces are arranged with respect to two orthogonal axes.

17. A magnetic structure as claimed in claim 1, wherein the structure provides permanent magnet elements, combined to the coils or completely replacing them.

18. A magnetic structure as claimed claim 1, wherein the yoke has an annular closed shape, in which the cavity is only open on two opposite sides, transverse to the axis.

19. A magnetic structure as claimed in claim 1, wherein the yoke has given an annular open shape, that is a C- or U-shape.

20. A magnetic structure as claimed in claim 1, wherein the yoke is a connection element between means for defining a cavity i. e. a predetermined volume which means only define the cavity on two opposite sides, and consist of the opposite sides of the pairs of opposite pole pieces.

21. A magnetic structure as claimed in claim 20, wherein the different pairs of pole pieces are arranged concentrically, the outer pole pieces having annular shapes, the pairs of pole pieces having circular shapes.

22. A magnetic structure as claimed in claim 1, wherein the yoke has a C- or U-shape, the different pairs of pole pieces being arranged side-by-side in the direction starting from the closed side to the opposite open side of the yoke.

23. A magnetic structure as claimed in claim 22, wherein the magnetic structure has two pairs of pole pieces, having different lengths, and defining magnetic gaps of different size, the pole pieces on the open side of the U-shaped yoke being shorter than the adjacent ones, on the opposite closed side of the yoke, while the region being meant to receive the relevant part for the examination of the body or of the part thereof, corresponds to the magnetic gap, between the two pole pieces being closer to the closed side of the yoke.

24. A magnetic structure as claimed in claim 23, wherein the opposite sides of the pole pieces being closer to the closed side of the yoke are substantially plane and, along the edge facing said closed side, have an extension towards the inside of the cavity, in the form of a tooth with a preferably rectangular trapezium-shaped section.

25. A magnetic structure as claimed in claim 1, wherein the pole pieces extend with a projecting edge beyond the ends of the opposite branches of the U-shaped yoke, which edge laterally tapers towards its projecting end, partially superposing the coil.

26. A magnetic structure as claimed in claim 1, wherein the inner pole pieces are respectively associated to a coil, which surrounds the corresponding pole piece and the other adjacent pole piece, and to a coil, only surrounding said further pole piece.

27. A magnetic structure as claimed in claim 1, wherein the coils are divergently inclined in the direction from the closed side to the open side of the U-shaped yoke.

28. A machine for detecting nuclear magnetic resonance images, wherein the machine is designed for the detection of images in a shoulder zone and in that the machine has a construction as claimed in claim 1.

29. A magnetic structure as claimed in claim 1, wherein the pole pieces have lateral portions on at least one side completely superposing the side of the coil facing the inside of the cavity.

* * * * *